(12) United States Patent
Kato et al.

(10) Patent No.: US 9,759,774 B2
(45) Date of Patent: Sep. 12, 2017

(54) ANOMALY DIAGNOSIS SYSTEM, METHOD, AND APPARATUS

(71) Applicant: Hitachi, Ltd., Chiyoda-ku, Tokyo (JP)

(72) Inventors: Tetsuji Kato, Tokyo (JP); Kohji Maki, Tokyo (JP); Tomoaki Hiruta, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 15/041,131

(22) Filed: Feb. 11, 2016

(65) Prior Publication Data

US 2016/0245851 A1    Aug. 25, 2016

(30) Foreign Application Priority Data

Feb. 23, 2015  (JP) .................................. 2015-033085

(51) Int. Cl.
  *G01R 31/34* (2006.01)
(52) U.S. Cl.
  CPC .................................. *G01R 31/343* (2013.01)
(58) Field of Classification Search
  CPC .............. G01R 31/343; G01R 31/3187; G01R 31/025; G01N 33/04; G01N 21/35; H01L 21/6719; H01L 21/78
  USPC .......... 324/765.01, 500, 520, 691, 681, 707, 324/727, 160, 76.11, 76.19, 76.39, 85; 702/67, 77, 104, 185, 33–35, 183; 340/648, 658; 327/21, 44
  See application file for complete search history.

(56) References Cited

U.S. PATENT DOCUMENTS

| 6,831,477 B2 * | 12/2004 | Fukusumi | ............ G01R 31/343 |
| | | | 324/765.01 |
| 2017/0072991 A1 * | 3/2017 | Hayashi | ................. B62D 5/049 |

FOREIGN PATENT DOCUMENTS

JP          11-83686 A       3/1999

* cited by examiner

*Primary Examiner* — Melissa Koval
*Assistant Examiner* — Trung Nguyen
(74) *Attorney, Agent, or Firm* — Crowell & Moring LLP

(57) ABSTRACT

An anomaly diagnosis system is provided that includes: a current-value obtaining part 111 that obtains a value of an AC current inputted to or outputted from a device to be diagnosed; a frequency analyzing part 112 that converts the current values obtained at intervals into a frequency spectrum which correlates a current intensity with a frequency; an anomaly-judging-value calculating part 113 that calculates at intervals a frequency width of the frequency spectrum at a current intensity "As" satisfying As=m×At (0<m<1), where "At" is a peak current intensity associated with an analysis frequency which is an integer multiple of a frequency of the AC current; and a judging part 114 that judges whether the frequency width is wider than that in a normal condition and, if it holds true, judges that the device is in an anomalous condition.

17 Claims, 17 Drawing Sheets

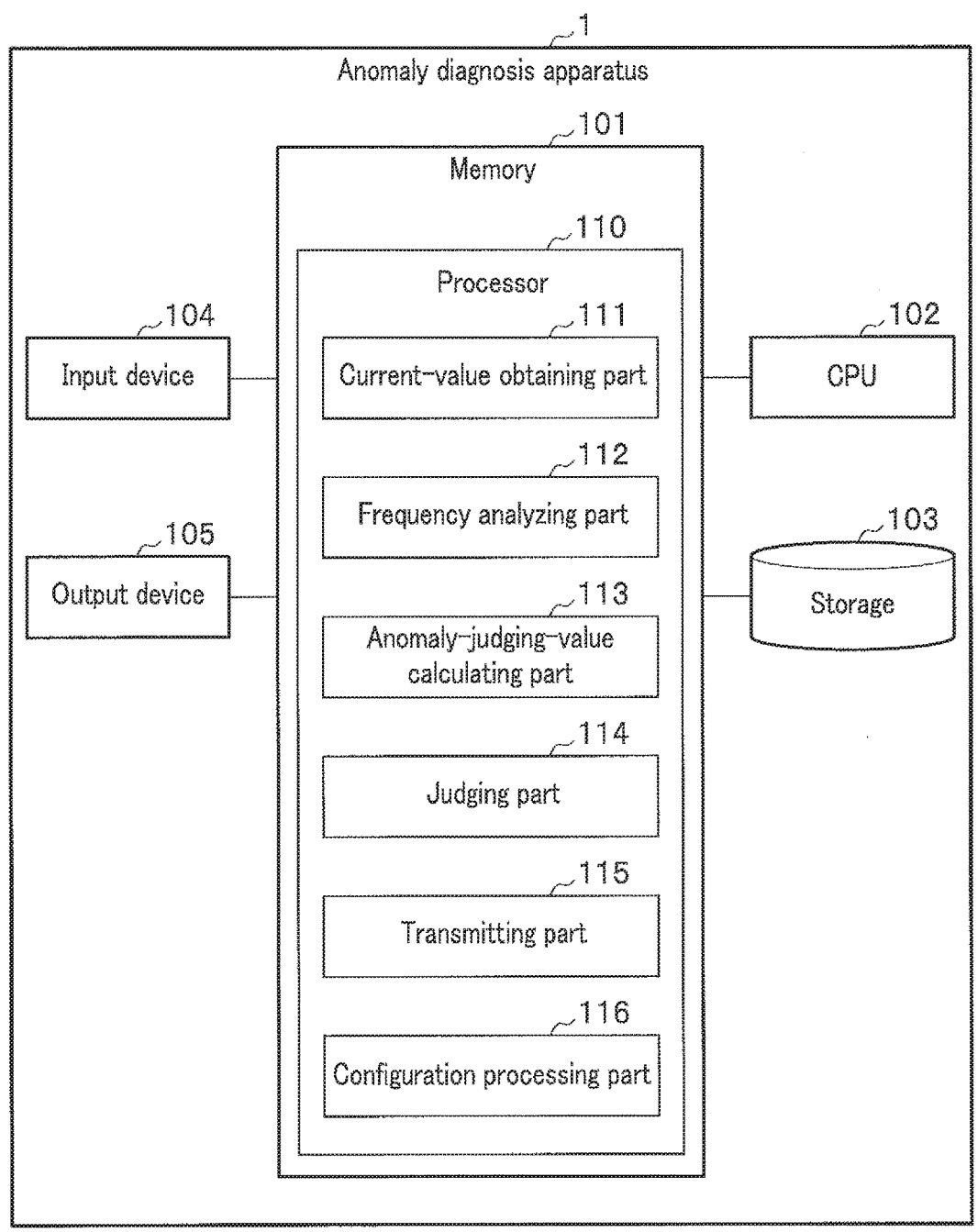

Normal condition

Anomalous condition

Time
Current pattern B, Anomalous case

Current pattern B, Anomalous case

ANOMALY DIAGNOSIS SYSTEM, METHOD, AND APPARATUS

TECHNICAL FIELD

The present invention relates to an anomaly diagnosis system, an anomaly diagnosis method, and an anomaly diagnosis apparatus for judging an anomaly of a device to be diagnosed.

BACKGROUND ART

If a rotating machine (a rotating electrical machine) such as a motor or a generator suddenly fails due to a bearing damage or the like, an unplanned repair action or exchange is required. Then, a sudden failure of the rotating machine causes lower availability of the production facility or a readjustment of the production plan. Conventionally, a rotating machine has been stopped as appropriate to diagnose the rotating machine in an offline state for checking a degradation state of the rotating machine. Such a diagnosis may allow for preventing a sudden failure, but requires the rotating machine to be stopped for the offline diagnosis. For this reason, such a diagnosis method causes lower availability of the production facility.

In view of such a background, there is a growing need for an online diagnosis that allows for diagnosing a rotating machine in operation.

For example, an online diagnosis method for a rotating machine is disclosed in Japanese Patent Application Publication No. H11-83686. The diagnosis method for a rotating machine disclosed in Japanese Patent Application Publication No. H11-83686 calculates a diagnosis parameter based on a power frequency of a motor and a high frequency spectrum of a load current signal spectrum of the motor. Then, the method compares the calculated diagnosis parameter with a criterion value set in advance for each mechanical equipment to be diagnosed, and if the calculated diagnosis parameter is larger than the criterion value, the mechanical equipment is judged to be in error. That is, the technique disclosed in Japanese Patent Application Publication No. H11-83686 diagnoses an anomaly of a rotating machine based on the peak in a specific frequency component.

SUMMARY OF THE INVENTION

Problems to be Solved

However, there is a case where an anomaly of a rotating machine does not surface as a spectrum having a peak in a specific frequency component. In such a case, the technique disclosed in Japanese Patent Application Publication No. H11-83686 fails to easily detect the anomaly of the rotating machine. A possible reason of the anomaly of the rotating machine not surfacing as the frequency peak might be such that the anomaly is covered by a frequency peak caused by other device or the anomaly has a characteristic of not having a physical peak.

The present invention has been made in view of such circumstances in order to efficiently detect an anomaly of a device.

Solution to Problems

In order to solve the above-described problem, the present invention is characterized in that an AC current value inputted to or outputted from a device to be diagnosed is frequency-analyzed and, if a width of a frequency spectrum as a result of the frequency analysis is wider than that in a normal condition, a judgment is made that there is an anomaly in the device.

Advantageous Effects of the Invention

According to the present invention, an anomaly of a device can efficiently be detected.

BRIEF DESCRIPTION OF THE DRAWINGS

FIG. 2 is a diagram showing an exemplary configuration of an anomaly diagnosis apparatus according to the first embodiment;

DETAILED DESCRIPTION OF EMBODIMENTS

Hereinafter, embodiments for implementing the invention will be described in detail with reference to the drawings as appropriate.

The inventors have found in anomalies of a rotating machine not surfacing as a spectrum having a peak in a specific frequency component that there is an anomaly in which a current intensity in the vicinity of a drive frequency increases and a proportion of time while a current value being on the increase in a unit of time changes. The embodiment is characterized in that an anomaly of a rotating machine is diagnosed based on an increase of a current value in the vicinity of a drive frequency (a frequency of a device to be diagnosed) and a proportion of time while a current value being on the increase in a unit of time. Note that an increase of current intensity in the vicinity of the drive frequency and a proportion of time while current intensity being on the increase in a unit of time will be described later.

First Embodiment

System Configuration

Figure 1:
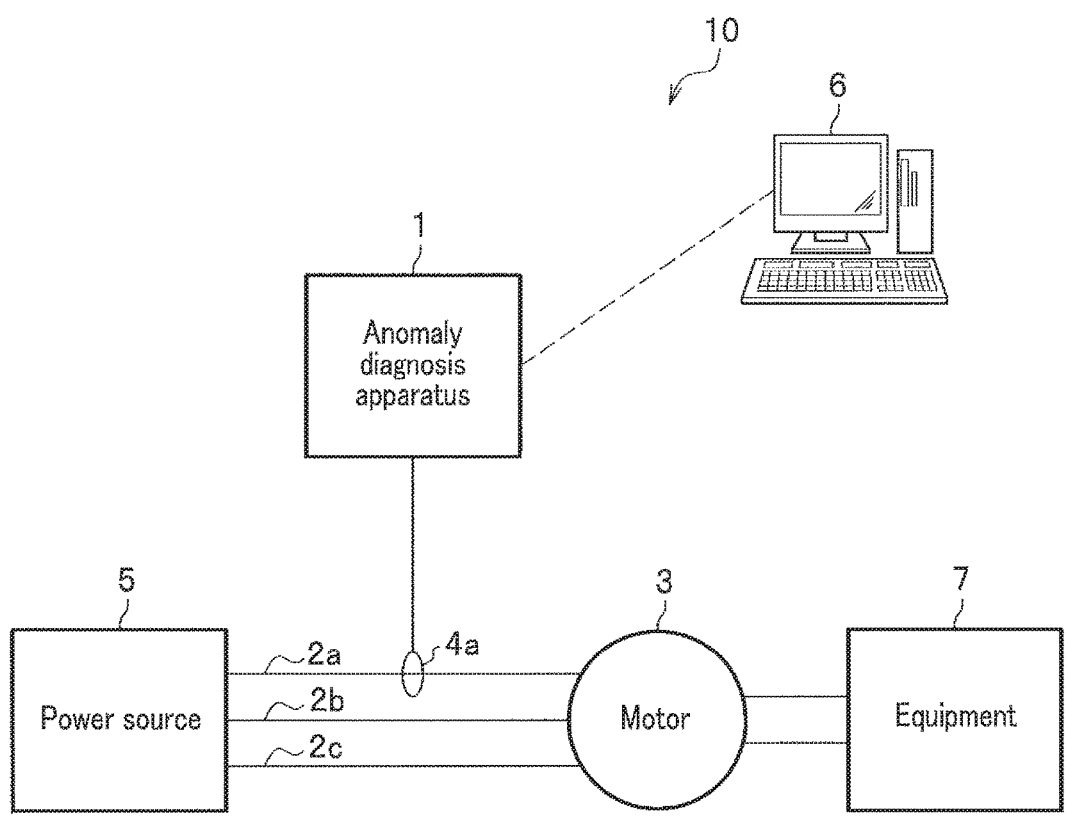
FIG. 1 is a diagram showing an exemplary configuration of an anomaly diagnosis system according to a first embodiment.

FIG. 1 is a diagram showing an exemplary configuration of an anomaly diagnosis system according to a first embodiment.

In an anomaly diagnosis system 10, electrical power is supplied from a power source 5 to a motor 3 through power lines 2a to 2c. Then, equipment 7 is operated by the rotational energy of the motor (device to be diagnosed) 3.

The power line 2a is arranged with a current sensor 4a such that the power line 2a is encircled. An anomaly diagnosis apparatus 1 detects the anomaly (here, degradation) of the motor 3 through a frequency analysis of an AC current value (hereinafter, referred to as a current value) obtained from the current sensor 4a. In addition, the anomaly diagnosis apparatus 1 sends an anomaly diagnosis result, for example, to a user terminal 6 connected via a network or the like, and then the user terminal 6 displays the received anomaly diagnosis result on a display device. Further, settings for anomaly diagnosis can be made based on the information inputted from the user terminal 6.

Note that, in the present embodiment, a three-phase motor using three power lines 2a to 2c has been described, but a motor using a different number of phases may be used. In addition, the current sensor 4a is not limited to a specific type, and a sensor such as a through current sensor, a cramp current sensor, a split-core current sensor, or an optical fiber sensor using a magneto-optical effect can be used. Note that, in the present embodiment, the current sensor 4a is arranged so as to encircle the power line 2a, but may not be arranged so as to encircle the power line as long as the value of the current flowing from the power source 5 to the motor 3 can be measured. In addition, the current sensor 4a is arranged at the power line 2a, but may be arranged at the power line 2b or the power line 2c.

[Configuration of Anomaly Diagnosis Apparatus]

FIG. 2 is a diagram showing an exemplary configuration of the anomaly diagnosis apparatus according to the first embodiment. The anomaly diagnosis apparatus will be described with reference to FIG. 1 as appropriate.

The anomaly diagnosis apparatus 1 includes a memory 101, a central processing unit (CPU) 102, a storage 103 such as a Hard Disk (HD), an input device 104 through which a current value measured by the current sensor 4a is inputted or information is inputted from the user terminal 6, and an output device 105 which sends an anomaly diagnosis result obtained by the anomaly diagnosis apparatus 1 to the user terminal 6.

A program stored in the storage 103 is loaded into the memory 101, and the loaded program is executed by the CPU 102 to have a processor 110 and those parts which constitute the processor 110, such as a current-value obtaining part 111, a frequency analyzing part 112, an anomaly-judging-value calculating part 113, a judging part 114, a transmitting part 115, and a configuration processing part 116.

The current-value obtaining part 111 obtains current values measured by the current sensor 4a, through the input device 104.

Figure 3A:
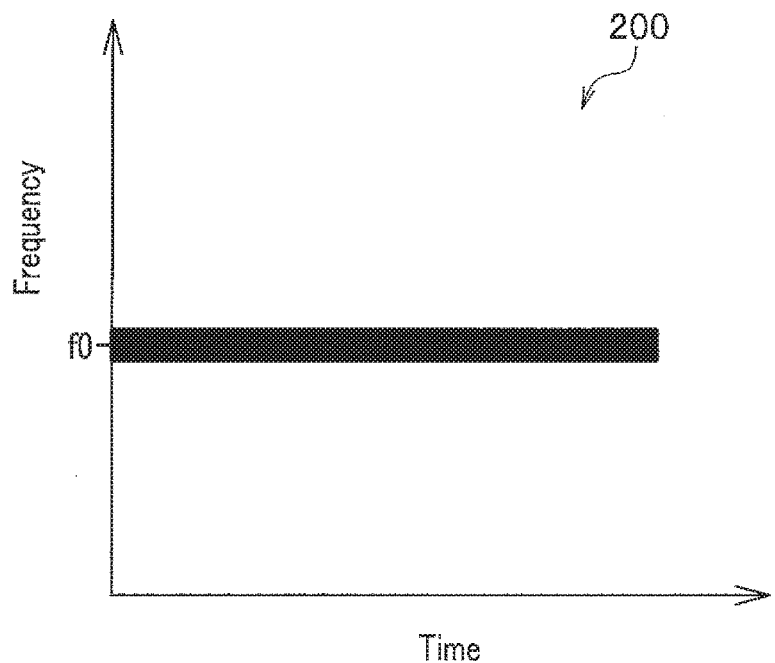
FIGS. 3A and 3B each illustrate temporal frequency variation 200 according to the first embodiment.
Figure 3B:
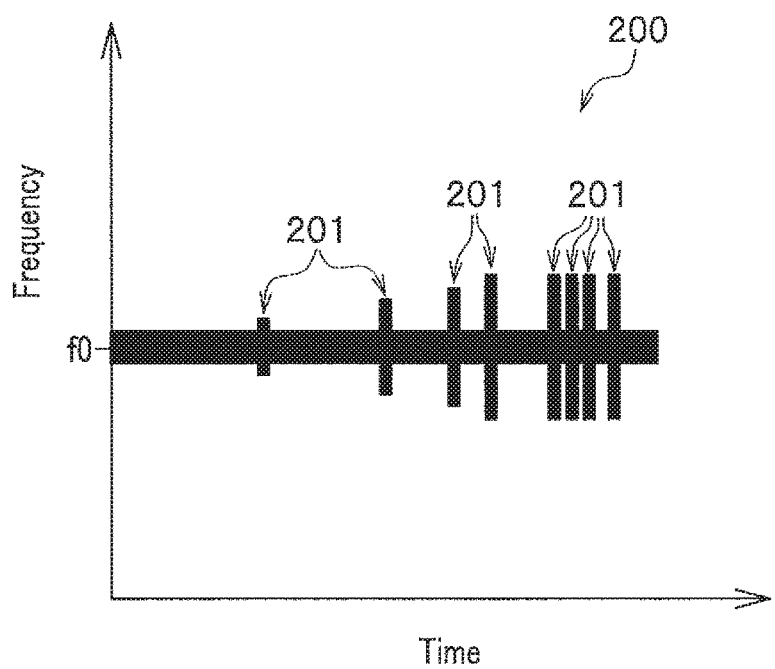

The frequency analyzing part 112 frequency-analyzes current values obtained by the current-value obtaining part 111 at intervals to calculate the temporal frequency variation 200 (FIGS. 3A and 3B). The temporal frequency variation 200 will be described later.

The anomaly-judging-value calculating part 113 calculates anomaly judging values such as a current-intensity increase and the proportion of on-the-increase current intensity. The current-intensity increase and the proportion of on-the-increase current intensity will be described later.

The judging part 114 judges the anomaly of the motor 3 based on the calculated anomaly judging values.

The transmitting part 115 sends a judging result by the judging part 114 to the user terminal 6 through the output device 105.

The configuration processing part 116 incorporates the settings for anomaly diagnosis through the input device 104.

Note that the present embodiment has the parts 111 to 116 and the storage 103 installed in one device, but is not limited to this configuration, and at least one of the parts 111 to 116 and the storage 103 may be installed in another device.

[Example of Temporal Frequency Variation]

FIGS. 3A and 3B are charts illustrating an example of the temporal frequency variation according to the first embodiment.

As shown in FIGS. 3A and 3B, the temporal frequency variation 200 illustrates a temporal change of frequency spectrum, where the horizontal axis indicates the time, and the vertical axis indicates the frequency.

In addition, FIG. 3A illustrates the temporal frequency variation 200 in a normal condition and FIG. 3B illustrates the temporal frequency variation 200 in an anomalous condition.

Figure 4A:
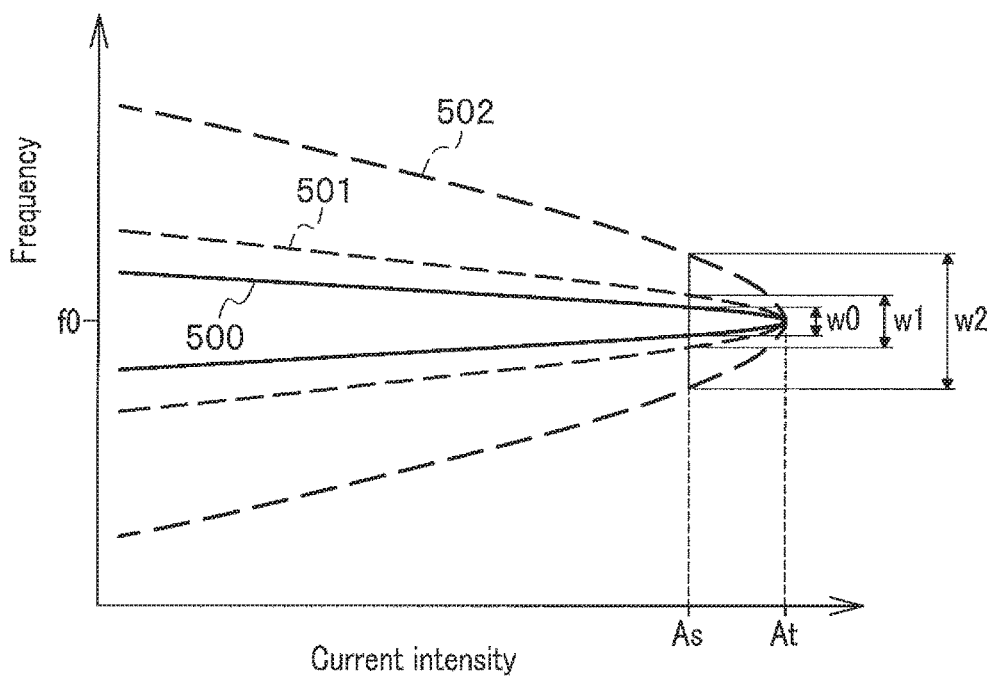
FIGS. 4A and 4B are explanatory charts for the temporal frequency variation 200 according to the first embodiment.
Figure 4B:
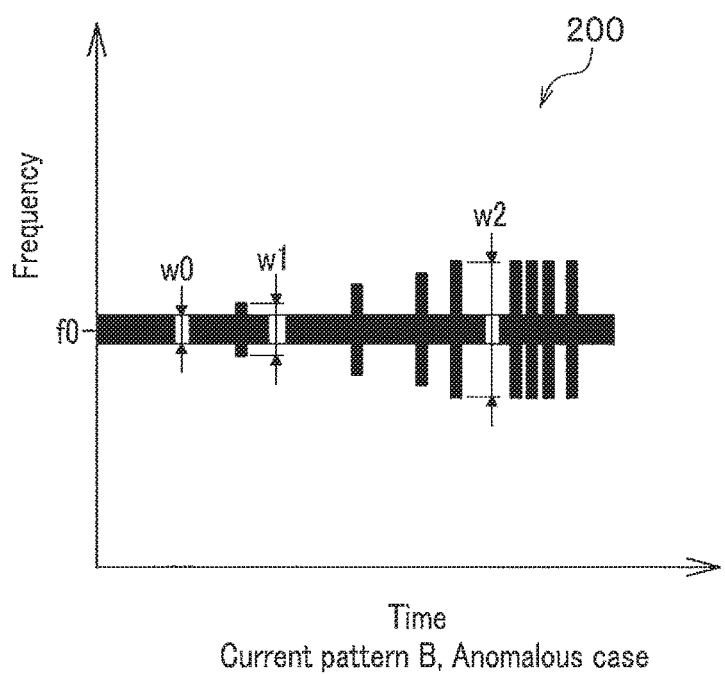

Here, FIGS. 4A and 4B will be referred to describe how to read the temporal frequency variation 200 shown in FIGS. 3A and 3B.

FIG. 4A is a frequency spectrum chart illustrating a relation between a current intensity and a frequency, and FIG. 4B illustrates the temporal frequency variation 200 shown in FIG. 3B.

Here, a width of the temporal frequency variation 200 shown in FIG. 4B corresponds to a width of the frequency spectrum at an arbitrary current intensity "As" in FIG. 4A. Incidentally, a frequency f0 is a drive frequency as a current frequency for driving the motor 3. Assuming that a peak value of the frequency spectrum is "At," "As" is a current intensity obtained by Equation (1) as shown below.

$$As = m \times At \quad (0 < m < 1) \qquad (1)$$

A width w0 in FIG. 4B is a width w0 of a narrow frequency spectrum 500 at the current intensity "As."

In addition, a width w2 in FIG. 4B is a width w2 of a wide frequency spectrum 502 at the current intensity "As."

Further, a width w1 in FIG. 4B is a width w1 of a frequency spectrum 501, which has an intermediate width, at the current intensity "As."

Note that the frequency spectrum 500 is shown in a normal condition, and the frequency spectrums 501, 502 are shown in an anomalous condition.

In the present embodiment, the magnitude of the current intensity in FIG. 4A is assumed to be displayed in a logarithmic scale, but may be displayed in a linear scale depending on the measurement result, or the magnitude of the current spectrum may be converted by a function.

Now, a description returns to FIGS. 3A and 3B.

The temporal frequency variation 200 in the normal condition, shown in FIG. 3A, shows no remarkable changes in the magnitude of the frequency spectrum over time on both sides of the drive frequency f0.

In contrast to FIG. 3A, the temporal frequency variation 200 in the anomalous condition in FIG. 3B shows a phenomenon in which the width of the frequency spectrum extends in the frequency axis direction, such as indicated by a reference numeral 201. That is, the temporal frequency variation 200 in the anomalous condition has the width of the frequency spectrum extended in places. With the increasing degradation of the motor 3, the phenomenon in which the width of the frequency spectrum is extended occurs more often, and the width of the frequency spectrum in the phenomenon increases.

Here, in Equation (1), the widths w0 to w2 with m=0.5 may be used (such widths w0 to w2 will be referred to as half-value widths).

Using such half-value widths as w0 to w2 makes a variation level of the widths w0 to w2 larger than that in the case of "m" being 0.5<m<1, and then facilitates calculating the anomaly judging value to be described later.

[Anomaly Judging Value]

Next, an anomaly judging value will be described with reference to FIGS. 5 and 6.

<Current-Intensity Increase>

Figure 5:
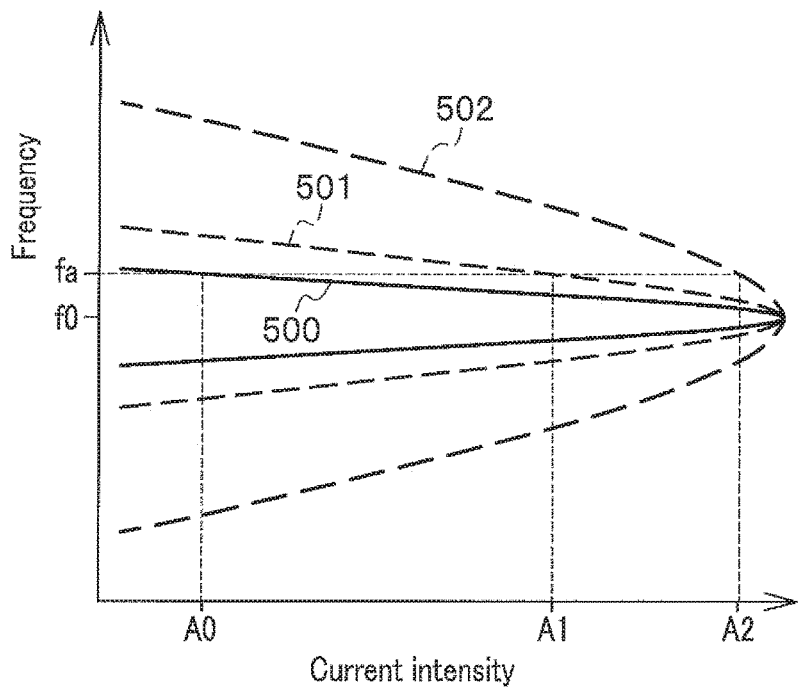
FIG. 5 is an explanatory chart for a current-intensity increase.

FIG. 5 is an explanatory chart of a current-intensity increase.

In FIG. 5, the frequency spectrums 500 to 502 are similar to those in FIG. 4A.

Here, an arbitrary frequency "fa" is set in the vicinity of the drive frequency f0. Then, the anomaly-judging-value calculating part 113 calculates current intensities A0 to A2 of the respective frequency spectrums 500 to 502 at the frequency "fa." As described above, the frequency spectrum 500 is the frequency spectrum in the normal condition, and then the current intensity A0 is the current intensity in the normal condition. Additionally, the current intensities A1, A2 calculated from the frequency spectrums 501, 502 in the anomalous condition are the current intensities in the anomalous condition. The current intensities A1, A2 may be the increased amounts of current intensity, or current intensities A1-A0, A2-A0 may be the increased amounts of current intensity.

Note that the current-intensity increase indicates an "increase of current intensity in the vicinity of the drive frequency (increase of current intensity associated with the arbitrary frequency in the vicinity of the analysis frequency)" as described earlier.

<Proportion of on-the-Increase Current Intensity>

Figure 6:
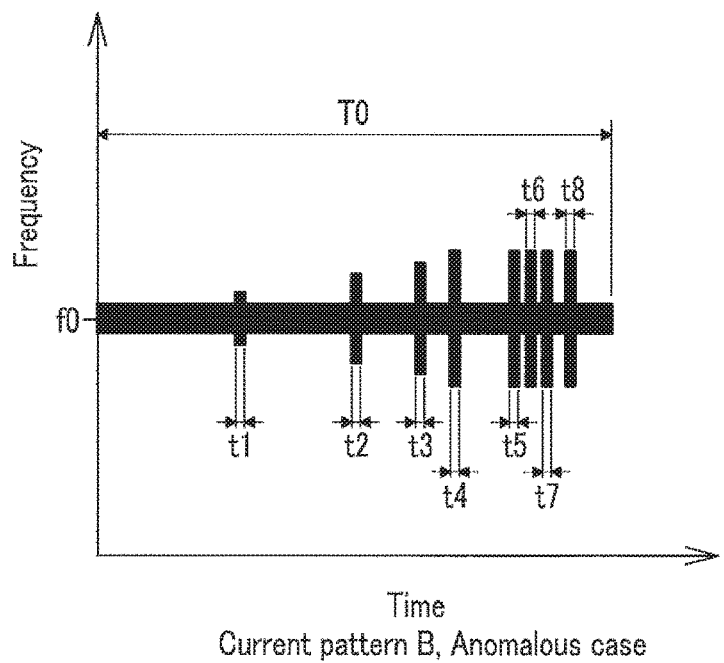
FIG. 6 is an explanatory chart for a proportion of on-the-increase current intensity.

FIG. 6 is an explanatory chart of the proportion of on-the-increase current intensity.

The proportion of on-the-increase current intensity indicates a proportion of time during which the temporal frequency variation 200 has a width of a predetermined threshold value or more in a unit of time. Note that the proportion of on-the-increase current intensity indicates a "proportion in a unit of time while current intensity being on the increase (proportion in a unit of time during which a frequency width is wider than that in a normal condition)" as described earlier.

In FIG. 6, the proportion of on-the-increase current intensity is obtained by dividing the sum of time during which the width of the temporal frequency variation 200 in the frequency axis direction is equal to or larger than a predetermined value by a time T0. That is, in FIG. 6, a proportion of on-the-increase current intensity Tp is expressed by Equation (2) as shown below.

$$Tp=(t1+t2+t3+t4+t5+t6+t7+t8)/T0 \qquad (2)$$

[Flowchart]

Figure 7:
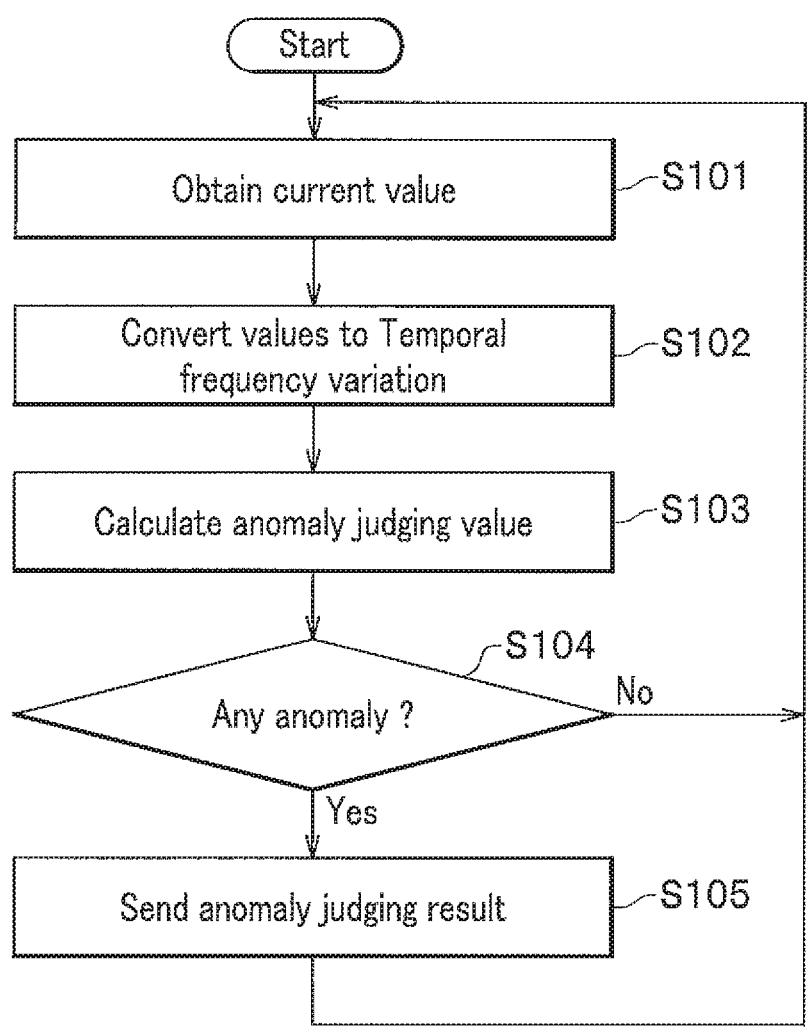
FIG. 7 is a flowchart showing a sequence of an anomaly diagnosis process according to the first embodiment.

FIG. 7 is a flowchart showing a sequence of an anomaly diagnosis process according to the first embodiment. The anomaly diagnosis process will be described with reference to FIGS. 1 and 2 as appropriate.

First, the current-value obtaining part 111 of the anomaly diagnosis apparatus 1 obtains a current value measured by the current sensor 4a (S101).

Then, the frequency analyzing part 112 frequency-analyzes the obtained load current data and converts the data to the temporal frequency variation 200 as temporal changes of the frequency spectrum (S102).

Next, the judging part 114 calculates an anomaly judging value from the converted temporal frequency variation 200 (S103). The anomaly judging value includes at least one of the current-intensity increase and the proportion of on-the-increase current intensity.

Then, the judging part 114 judges whether there is any anomaly in the motor 3 by using at least one of the current-intensity increase and the proportion of on-the-increase current intensity which have been calculated (S104). Judging the anomaly of the motor 3 will be described later.

If a judgment is made as a result of step S104 that there is no anomaly in the motor 3 (No in S104), the processor 110 makes processing return to step S101.

If a judgment is made as a result of step S104 that there is an anomaly in the motor 3 (Yes in S104), the transmitting part 115 sends the anomaly judging result for the motor 3 to the user terminal 6 (S105). Here, the anomaly judging result includes, for example, a parameter pertinent to a sign of degradation of the motor 3.

Note that the process shown in FIG. 7 may be performed within a time window that is set to have a predetermined time width and to move in the time axis direction.

[Anomaly Judging Process]

Figure 8:
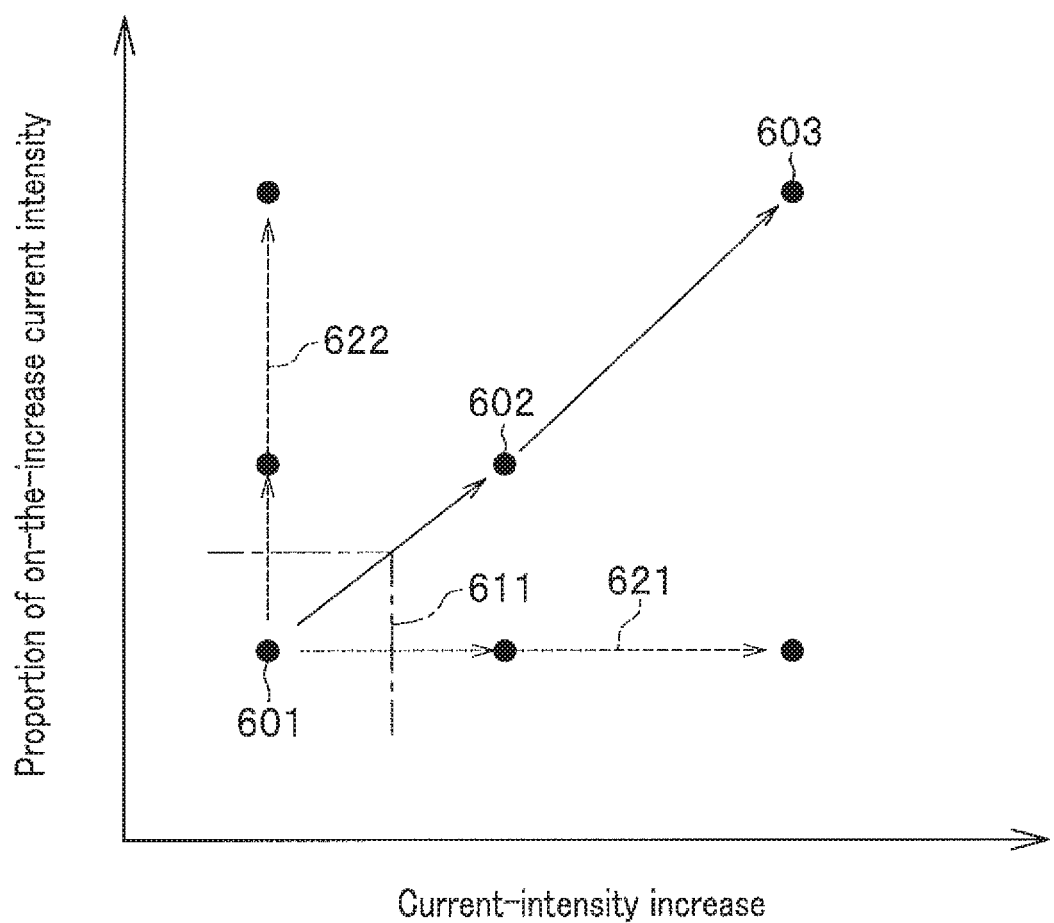
FIG. 8 is a chart illustrating a technique of judging an anomaly according to the first embodiment.

FIG. 8 is a chart illustrating a technique of judging an anomaly according to the first embodiment.

Note that the process in FIG. 8 corresponds to the process of step S104 in FIG. 7.

The judging part 114 plots the values calculated in step S103 in FIG. 7 in a graph as shown in FIG. 8 in which the horizontal axis indicates the current-intensity increase and the vertical axis indicates the proportion of on-the-increase current intensity. Note that the horizontal axis in FIG. 8 is assumed to be displayed in a linear scale, but may be displayed in a logarithmic scale.

That is, both the current-intensity increase and the proportion of on-the-increase current intensity are small at a point indicated by a reference numeral 601, however there is a tendency that, as the degradation increases, the current-intensity increase and the proportion of on-the-increase current intensity increase as indicated by reference numerals 602, 603.

Threshold values 611 may be set in advance for the current-intensity increase and the proportion of on-the-increase current intensity based on stored data, and if the plotted value exceeds the predetermined threshold value 611, the judging part 114 may judge that the condition is "anomalous." The threshold value may be determined by a user based on past data, or may be determined by the processor 110 analyzing past data for a relation between the current-intensity increase as well as the proportion of on-the-increase current intensity and the anomaly.

Note that the anomaly is judged here based on both the current-intensity increase and the proportion of on-the-increase current intensity, but the anomaly may be judged based on either one of the current-intensity increase and the proportion of on-the-increase current intensity.

If the anomaly is judged only with the current-intensity increase, its value moves in a direction indicated by a reference numeral 621 in FIG. 8 in accordance with increasing degradation of the motor 3. Also, if the anomaly is judged only with the proportion of on-the-increase current intensity, its value moves in a direction indicated by a reference numeral 622 in FIG. 8 in accordance with increasing degradation of the motor 3.

In either case, if the value exceeds the threshold value 611, the judging part 114 judges that the condition is anomalous.

Note that both the current-intensity increase and the proportion of on-the-increase current intensity increase in FIG. 8, however there may be a case where only one of them increases.

The anomaly diagnosis system 10 diagnoses the anomaly of a current-intensity increasing in the vicinity of a drive frequency as well as a proportion of on-the-increase current intensity in a unit of time changing, among anomalies of a rotating machine (the motor 3) which cause a spectrum not to have a peak in a specific frequency component of a load current of the rotating machine. This allows for detecting an anomaly of the rotating machine (the motor 3) before a failure. As a result, the anomaly diagnosis system 10 allows a scheduled outage of the rotating machine (the motor 3) before the rotating machine (the motor 3) completely fails and stops. Consequently, the anomaly diagnosis system 10 can efficiently detect the anomaly of the rotating machine (the motor 3).

Second Embodiment

System Configuration

Figure 9:
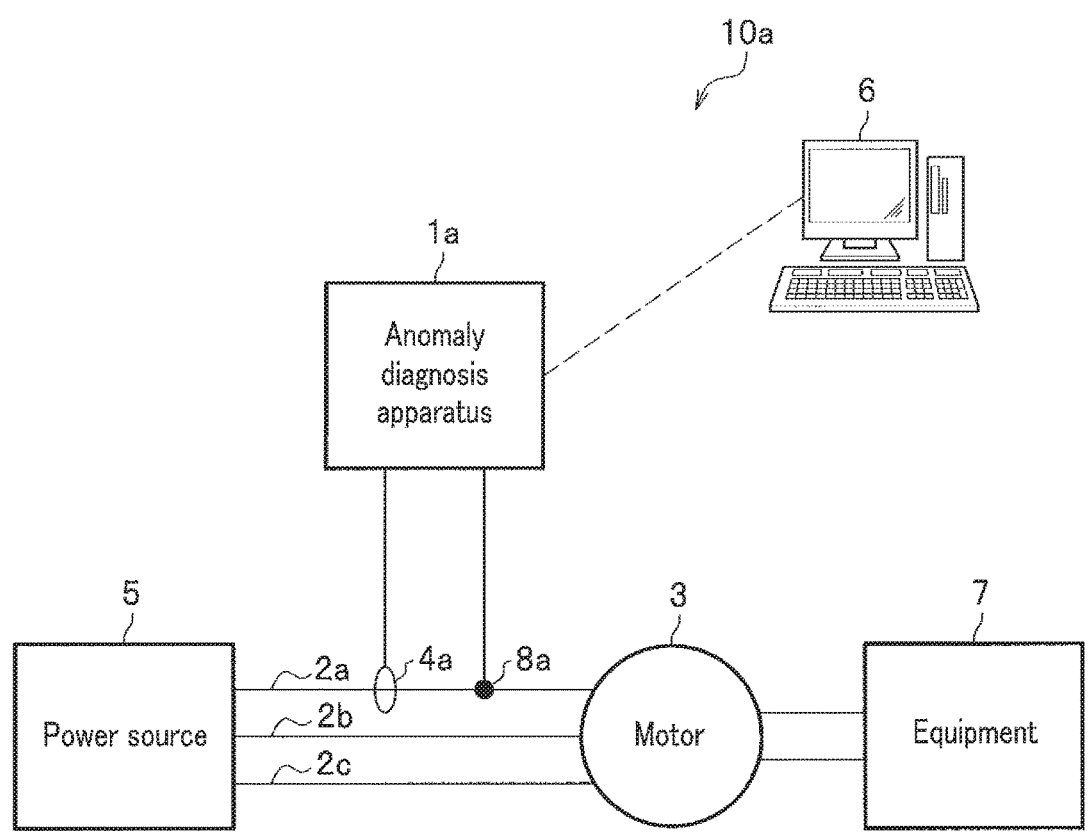
FIG. 9 is a diagram showing an exemplary configuration of an anomaly diagnosis system according to a second embodiment.

FIG. 9 is a diagram showing an exemplary configuration of an anomaly diagnosis system according to a second embodiment.

Here, a difference from FIG. 1 will be described, and the same components as those in FIG. 1 will be assigned with the same reference numerals to have the description thereof being omitted.

An anomaly diagnosis system 10a is different from the anomaly diagnosis system 10 in FIG. 1 on the point that a voltage sensor 8a is arranged on the power line 2a. Then, an anomaly diagnosis apparatus 1a diagnoses an anomaly of the motor 3 based on a current value measured by the current sensor 4a and an AC voltage value (hereinafter, referred to as a voltage value) measured by the voltage sensor 8a.

Note that the voltage sensor 8a is arranged on the power line 2a, but may be arranged on the power line 2b or the power line 2c. However, the voltage sensor 8a is preferably arranged on the power line 2a, 2b, or 2c on which the current sensor 4a is arranged.

[Configuration of Anomaly Diagnosis Apparatus]

Figure 10:
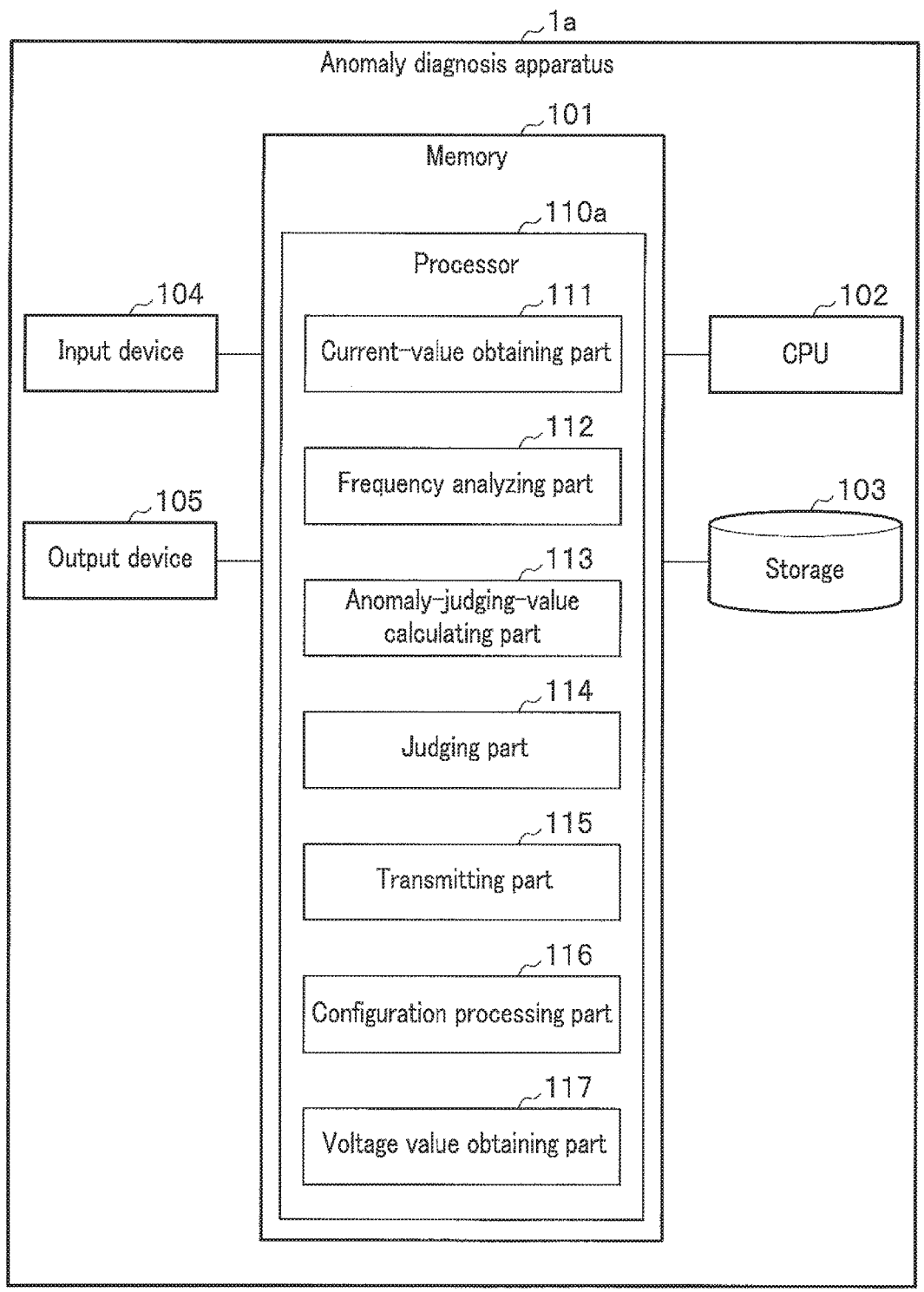
FIG. 10 is a diagram showing an exemplary configuration of an anomaly diagnosis apparatus according to the second embodiment.

FIG. 10 is a diagram showing an exemplary configuration of an anomaly diagnosis apparatus according to the second embodiment. The anomaly diagnosis apparatus will be described with reference to FIG. 9 as appropriate.

Here, a difference from FIG. 2 will be described, and the same components as those in FIG. 2 will be assigned with the same reference numerals to have the description thereof being omitted.

In the anomaly diagnosis apparatus 1a, a program stored in the storage 103 is loaded into the memory 101, and the loaded program is executed by the CPU 102 to have a voltage-value obtaining part 117 in a processing part 110a in addition to the parts 111 to 116 shown in FIG. 2.

The voltage-value obtaining part 117 obtains an AC voltage value (a voltage value) measured by the voltage sensor 8a, through the input device 104. Hereinbelow, a voltage value is assumed to be an AC voltage value.

[Flowchart]

Figure 11:
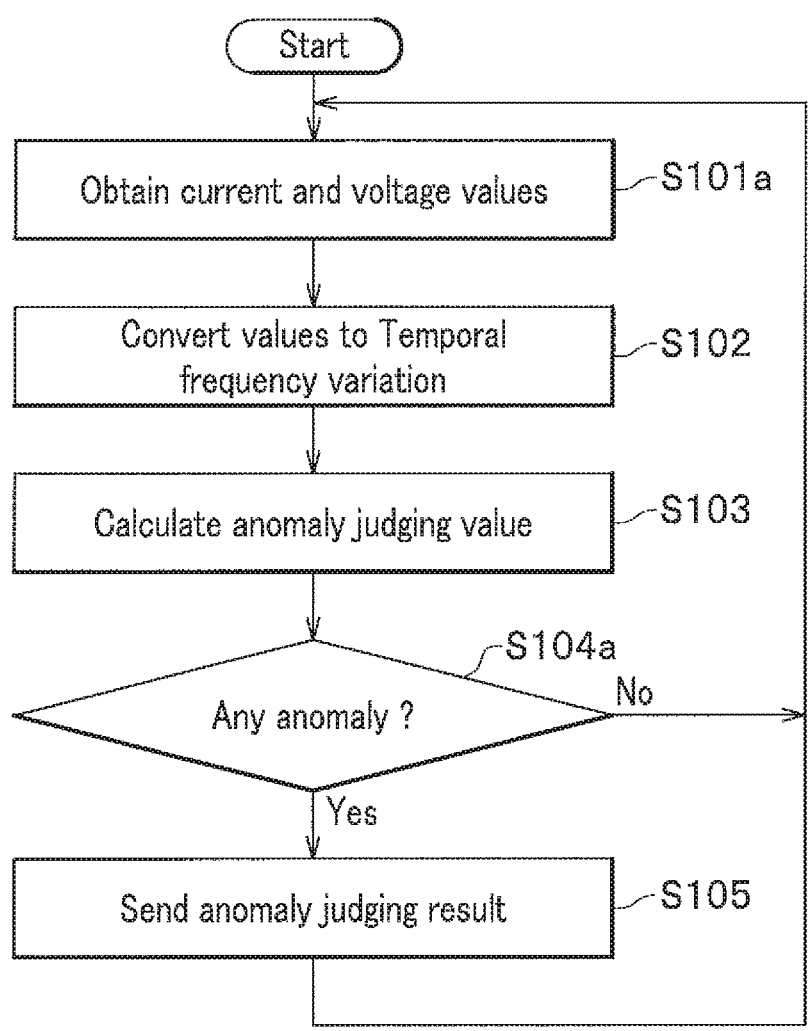
FIG. 11 is a flowchart showing a sequence of an anomaly diagnosis process.

FIG. 11 is a flowchart showing a sequence of an anomaly diagnosis process according to the present embodiment. The anomaly diagnosis process will be described with reference to FIGS. 9 and 10 as appropriate.

Note that different processing from FIG. 7 will be described here, and the same processing as that in FIG. 7 will be assigned with the same step number to have the description thereof being omitted.

In step S101a, the current-value obtaining part 111 obtains a current value measured by the current sensor 4a, and the voltage-value obtaining part 117 obtains a voltage value measured by the voltage sensor 8a.

Then, in step S104a, the judging part 114 judges whether there is any anomaly in the motor 3 by using the anomaly judging value and the voltage value (S104a).

Figure 12A:
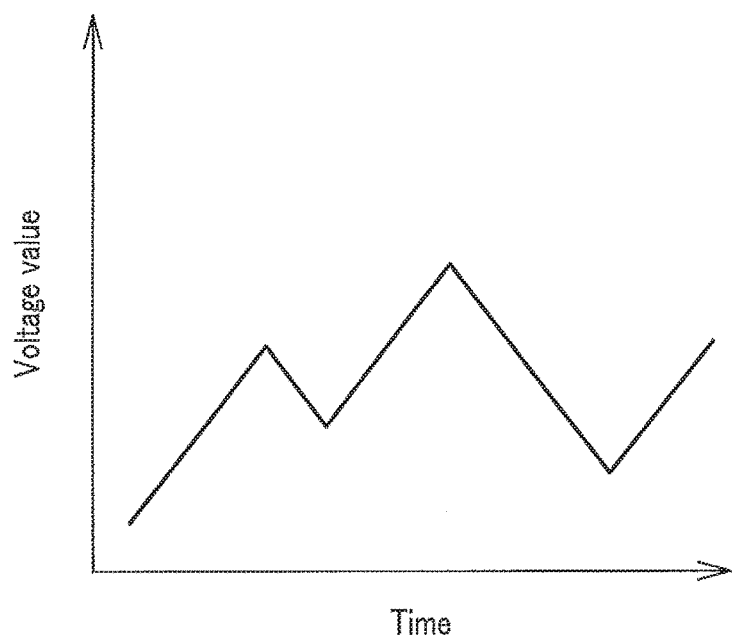
FIGS. 12A and 12B are charts illustrating a technique of judging an anomaly based on a voltage value according to the second embodiment.
Figure 12B:
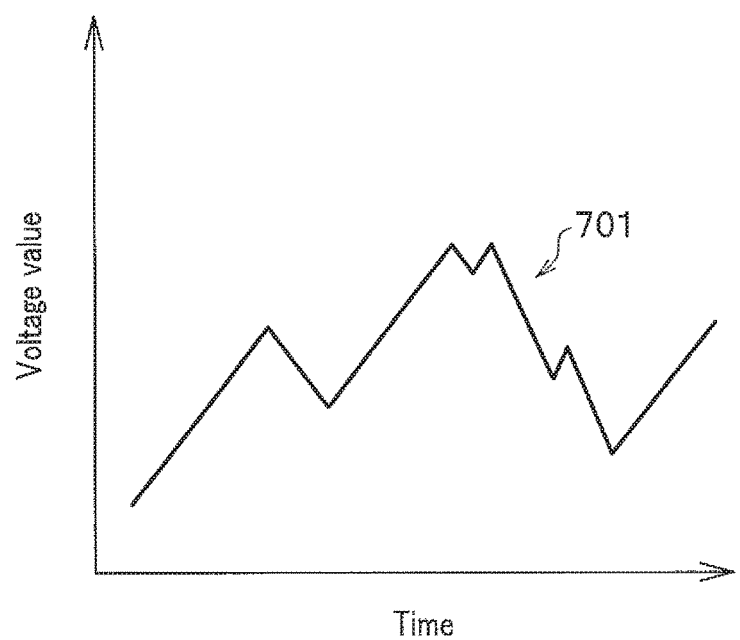

FIGS. 12A and 12B are charts illustrating a technique of judging an anomaly based on a voltage value, according to the second embodiment.

In the graph shown in FIGS. 12A and 12B, the horizontal axis indicates a time, and the vertical axis indicates a voltage value.

For example, FIG. 12A illustrates voltage changes (planned voltage changes) set in advance for controlling the motor 3. On the other hand, among voltage values in FIG. 12B measured by the voltage sensor 8a, voltage values indicated by a reference numeral 701 present increase and decrease.

The judging part 114, for example, matches temporal changes of measured voltage values with planned voltage changes, such as those shown in FIG. 12A, to detect an anomaly of the voltage values indicated by the reference numeral 701.

That is, the judging part 114 first uses the technique of the first embodiment to judge an anomaly of the motor 3. If an anomaly of the motor 3 is detected according to the technique of the first embodiment, the judging part 114 then judges an anomaly by using the voltage values as shown in FIGS. 12A and 12B.

In addition, the configuration shown as the second embodiment allows for distinguishing changes of anomaly judging values caused by the load current to the motor 3, due to a change in a voltage applied from the power source 5 to the motor 3, from changes of anomaly judging values caused by the degradation of the motor 3.

That is, there is a case where the anomaly of the frequency spectrum is detected due to a reason other than the anomaly of the motor 3, such as a large noise. In such a case, an anomaly judgment using the voltage value can be made along with the anomaly judgment of the first embodiment, as is the case with the second embodiment, to improve the accuracy of the anomaly diagnosis.

Third Embodiment

Figure 13:
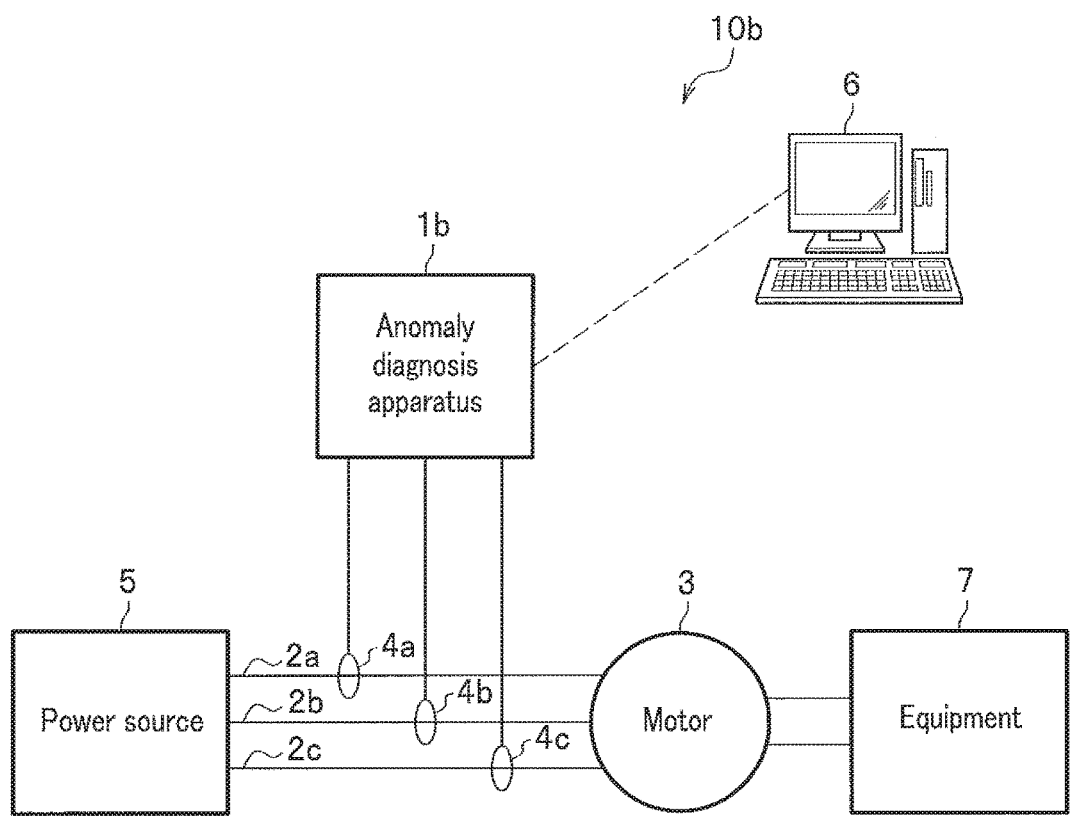
FIG. 13 is a diagram showing an exemplary configuration of an anomaly diagnosis system according to a third embodiment.

FIG. 13 is a diagram showing an exemplary configuration of an anomaly diagnosis system according to a third embodiment.

Here, a difference from FIG. 1 will be described, and the same components as those in FIG. 1 will be assigned with the same reference numerals to have the description thereof being omitted.

An anomaly diagnosis system 10b is different from the anomaly diagnosis system 10 in FIG. 1 on the point that current sensors 4a to 4c are respectively arranged on the power lines 2a to 2c. Then, an anomaly diagnosis apparatus 1b diagnoses an anomaly of each of the current values measured by the current sensors 4a to 4c in the same manner as the first embodiment.

According to the third embodiment, even if one of the current sensors 4a to 4c has a failure, the anomaly diagnosis can still be made with the rest of the current sensors 4a to 4c. This allows for improving the reliability of the anomaly diagnosis system 10b.

Fourth Embodiment

Figure 14:
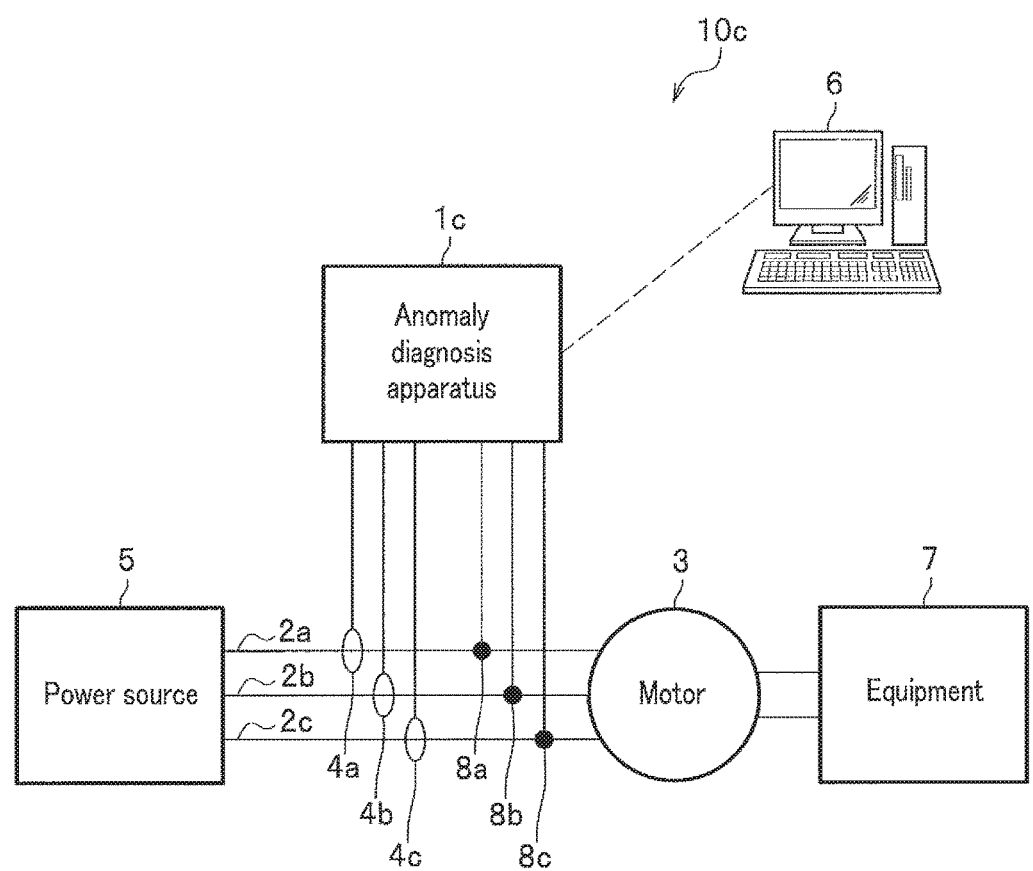
FIG. 14 is a diagram showing an exemplary configuration of an anomaly diagnosis system according to a fourth embodiment.

FIG. 14 is a diagram showing an exemplary configuration of an anomaly diagnosis system according to a fourth embodiment.

Here, a difference from FIG. 13 will be described, and the same components as those in FIG. 13 will be assigned with the same reference numerals to have the description thereof being omitted.

An anomaly diagnosis system 10c is different from the anomaly diagnosis system 10b in FIG. 13 on the point that voltage sensors 8a to 8c are respectively arranged on the power lines 2a to 2c. Then, an anomaly diagnosis apparatus 1c diagnoses an anomaly of each of the current values measured by the current sensors 4a to 4c and each of the voltage values measured by the voltage sensors 8a to 8c in the same manner as the second embodiment.

According to the fourth embodiment, even if one of the current sensors 4a to 4c and one of the voltage sensors 8a to 8c each have failures, the anomaly diagnosis can still be made with the rest of the current sensors 4a to 4c and the rest of the voltage sensors 8a to 8c. This allows for improving the reliability of the anomaly diagnosis system 10c while improving the accuracy of the anomaly diagnosis as with the second embodiment.

Fifth Embodiment

Figure 15:
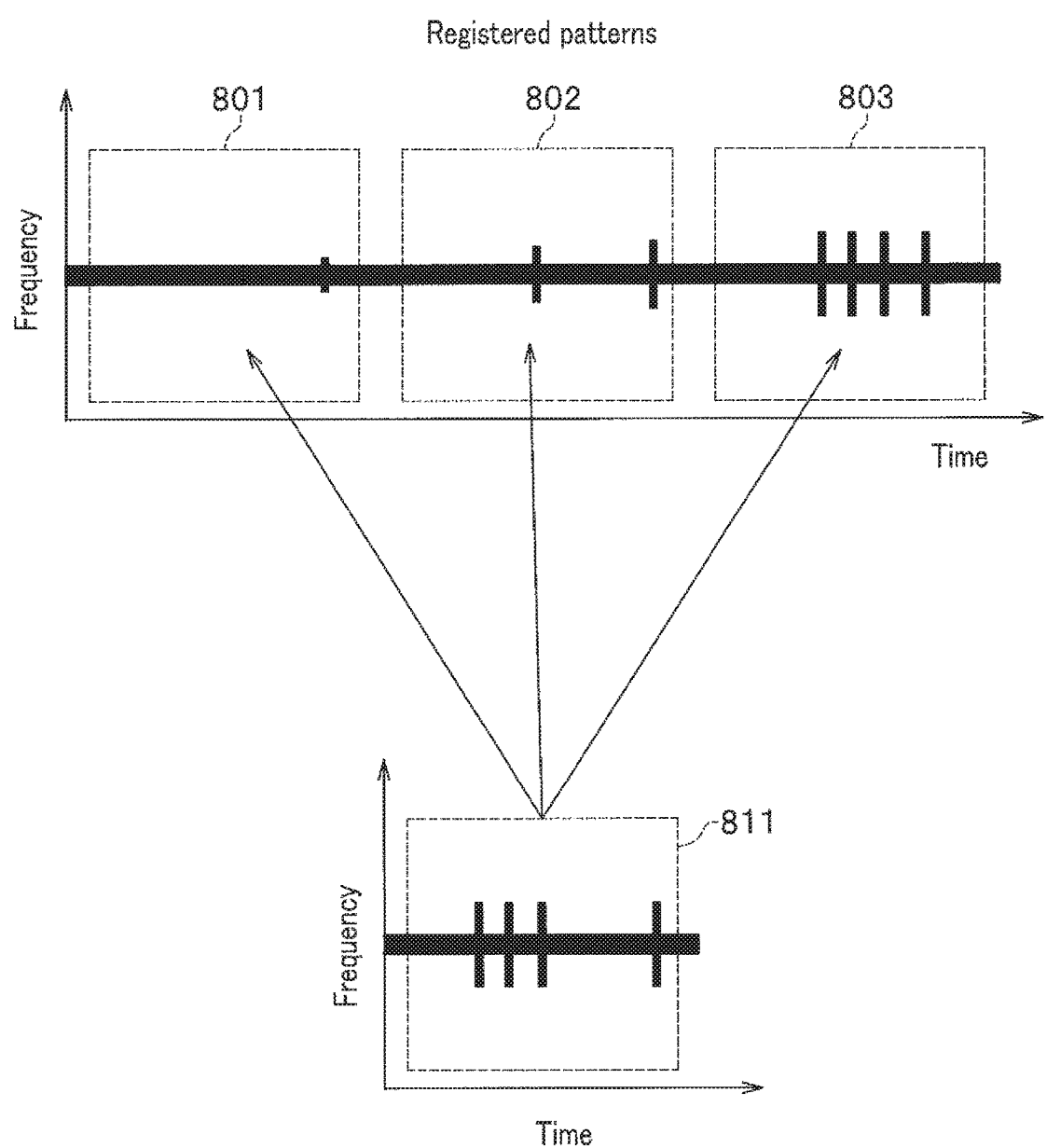
FIG. 15 is a diagram illustrating a technique of judging an anomaly according to a fifth embodiment.

In the first to fourth embodiments, anomaly of the motor 3 may be judged, instead of judging an anomaly as shown in FIG. 8, by comparing patterns of temporal frequency variation as shown in FIG. 15. Note that the processing shown in FIG. 15 is what is performed in step S104 in FIG. 7.

That is, in the fifth embodiment, the judging part 114 compares a correlation between each of patterns of temporal frequency variation 801 to 803 registered in advance and a spectrum pattern of temporal frequency variation 811 actually measured. Then, the judging part 114 identifies a portion of the spectrum pattern part having a similar characteristic (a high correlation) to determine a degradation level.

For example, a pattern of temporal frequency variation and its type of malfunction may be examined in advance, to predict the type of malfunction by comparing the patterns as shown in FIG. 15.

Note that comparing the patterns may be combined with the technique of judging an anomaly shown in FIG. 8, or FIGS. 12A and 12B.

Sixth Embodiment

Figure 16:
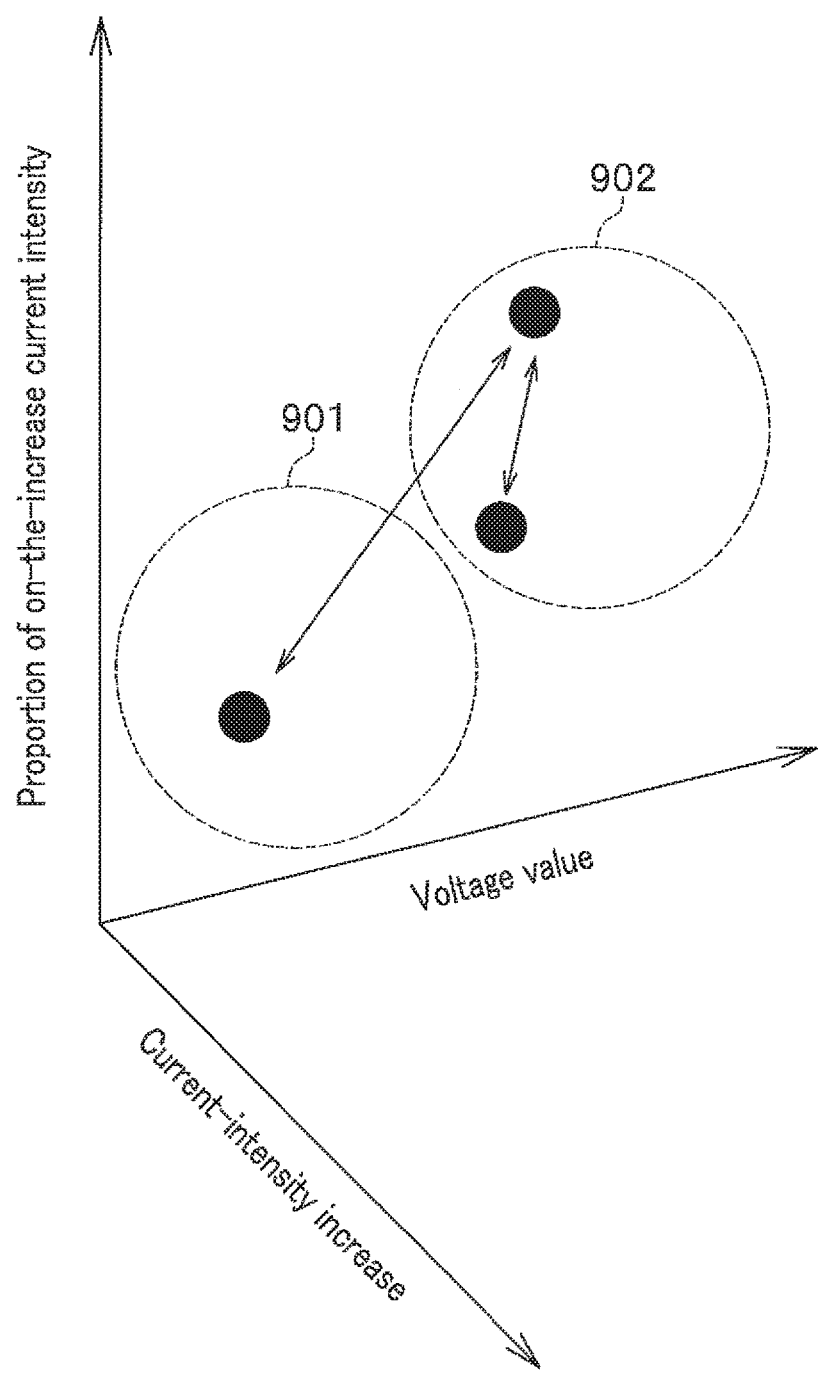
FIG. 16 is a chart illustrating a technique of judging an anomaly according to a sixth embodiment.

FIG. 16 is a chart illustrating a technique of judging an anomaly according to a sixth embodiment.

In FIG. 16, the judging part 114 projects measurement values into a multidimensional space having the axes of the current-intensity increase, the proportion of on-the-increase current intensity, and the voltage value applied to the motor 3, and then clusters the values by vector quantization. On the basis of a result of the clustering, the judging part 114 judges whether the motor 3 is normal or anomalous.

For example, it is assumed that clusters 901, 902 are obtained as shown in FIG. 16, as a result of the clustering. Then, if a plotted measurement value is included in the cluster 901, the judging part 114 judges that the motor is in a normal condition, and if a measurement value is included in the cluster 902, the judging part 114 judges that the motor is in an anomalous condition.

In addition, parameters used in the vector quantization (clustering) may include at least one of the current-intensity increase and the proportion of on-the-increase current intensity. That is, the axis of the voltage value may be omitted from the graph in FIG. 16. Further, a parameter such as a temperature, a vibration, or a running pattern can be selected, if necessary, as a parameter used for the vector quantization (clustering).

The sixth embodiment allows for judging an anomaly more objectively than the threshold values which are artificially set.

Seventh Embodiment

Figure 17:
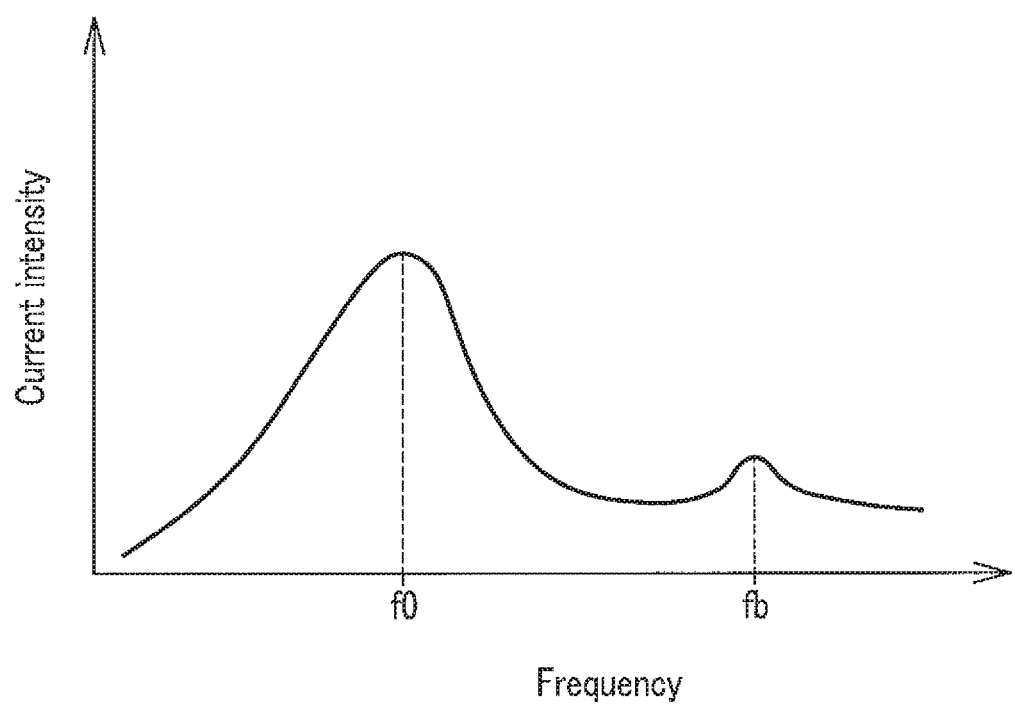
FIG. 17 is a chart illustrating an example of a frequency distribution.

FIG. 17 is a chart illustrating an example of a frequency distribution. In the first to sixth embodiments, the frequency spectrum on both sides of the drive frequency f0 is used, but a frequency spectrum on both sides of a frequency fb, shown in Equation (3) below, may be used to diagnose an anomaly.

$$fb = N \times f0 (N=1,2,3 \ldots) \quad (3)$$

Here, if N=1, the frequency spectrum on both sides of the drive frequency f0 is used to diagnose an anomaly.

In particular, a frequency spectrum on both sides of the frequency fb, which is calculated with N=6 M±1 (M=1, 2, 3 . . . ) in Equation (3), may be used to diagnose an anomaly. This uses a characteristic that a rotating machine such as the motor 3 has small peaks at frequencies which are the integer multiples of the drive frequency f0 (particularly, frequencies with the integer being 6M±1).

In this way, even when the frequency distribution on both sides of the drive frequency f0 is covered for the device to be diagnosed due to noises from the other device, an anomaly can be diagnosed by using a frequency spectrum on both sides of the frequency fb having a small peak.

Note that it often depends on the type of the rotating machine what frequency will have a small peak among the frequencies of integer multiples of the drive frequency f0.

Figure 18:
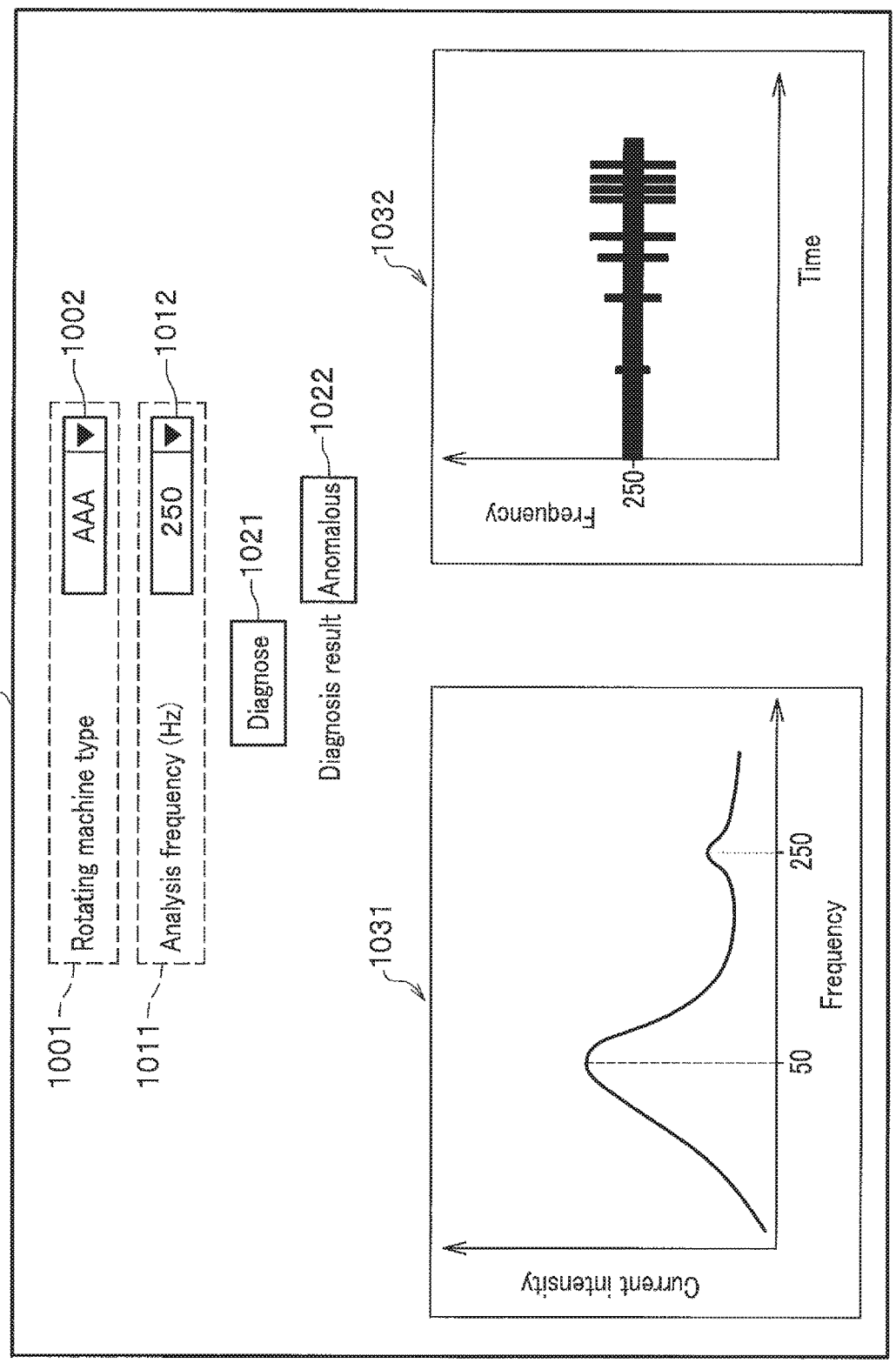
FIG. 18 is a diagram showing an example of an operation screen according to the present embodiments.

FIG. 18 is a diagram showing an example of an operation screen according to the present embodiments.

In an operation screen 1000, a rotating machine type field 1001 is a field for designating a rotating machine (motor 3 in the present embodiments) to be diagnosed for an anomaly. In the rotating machine type field 1001, a preset rotating machine can be designated by a pull down menu 1002.

In addition, a frequency setting field 1011 is a field for designating a central frequency for a frequency analysis (analysis frequency) in diagnosing an anomaly. The central frequency for a frequency analysis in diagnosing an anomaly refers to "f0" in FIGS. 3A, 3B and FIGS. 4A, 4B. In the frequency setting field 1011, the analysis frequency is set via a pull down menu 1012. As described in FIG. 17, it often depends on a type of the rotating machine what frequency will have a small peak among the frequencies of integer multiples of the drive frequency f0. Then, a frequency having a small peak may be preset in advance for each type of the rotating machine so that, when a type of the rotating machine is designated in the rotating machine type field 1001, the frequency associated with the designated type can be displayed. In this way, the analysis frequency can easily be set.

Further, in a frequency characteristic display area 1031, frequency characteristics are shown for the rotating machine type designated in the rotating machine type field 1001. The user can set the frequency in the frequency setting field 1011 with reference to the characteristics in the frequency characteristic display area 1031.

Such a setting of the anomaly diagnosis is incorporated by the configuration processing part 116 (FIG. 2).

Once the type of the rotating machine to be diagnosed for an anomaly and the analysis frequency are set, a diagnosis button 1021 may selectively be inputted through the input device of the user terminal 6.

Then, the process in FIG. 7 (or FIG. 11 as required) is performed to display the result of judging an anomaly in an anomaly judging result field 1022. Furthermore, the temporal frequency variation 200 is displayed in the temporal-frequency-variation display area 1032 by the frequency analyzing part 112.

The operation screen 1000 as described above allows the user to designate the analysis frequency based on visual information or to visually refer to the temporal frequency variation 200, to facilitate settings for the anomaly diagnosis and performing analysis.

In the present embodiments, the motor 3 is used as the rotation body, but a generator may be used as the rotation body. The anomaly of the generator can be detected as in the present embodiments because only the direction of the electric power flow is opposite to that of the motor 3. In addition, the present embodiments are assumed to detect the degradation of the motor 3, but the invention is not limited to the motor 3 or the generator. Even when there is an anomaly in a device or a power source connected to the motor 3 or the generator, the anomaly can be detected as in the present embodiments for some types of the anomaly. In some cases, the current value may increase in the vicinity of the drive frequency of the load current of the motor 3 or the generator, and/or the proportion of on-the-increase current intensity may change. For that reason, the invention allows for diagnosing the motor 3 as well as a device or a power source attached to the motor 3.

Further, the rotating machine includes a low-pressure rotating machine, a middle-pressure rotating machine, and a high-pressure rotating machine that are used in industrial fields.

Here, a result obtained by short-time Fourier transformation is presented by way of an example, but any technique such as wavelet transformation may be used that converts data into a physical amount which can be plotted in a chart having the horizontal axis indicative of a time and the vertical axis indicative of a frequency.

In addition, the present embodiments are assumed to have only two levels, i.e., "normal" and "anomalous," as the result of judging an anomaly, but two or more threshold values 611 in FIG. 8 may be set to judge an anomaly level. In this case, three or more clusters 901, 902 in FIG. 16 may be provided so as to be associated with respective levels.

Further, the anomaly diagnosis apparatus 1 may manually be inputted with a sequence of data that is taken with the drive frequency (analysis frequency) unchanged and indicates the current-intensity increase and/or the proportion of on-the-increase current intensity gradually increasing. Alternatively, the apparatus may be inputted on purpose with a sequence of data on the power lines 2a to 2c that is taken with the drive frequency (analysis frequency) unchanged and indicates the current-intensity increase and/or the proportion of on-the-increase current intensity gradually increasing. Conventional techniques diagnose an anomaly of the motor 3 through a change in a peak current of the current value at the drive frequency having a peak, and then fail to detect an anomaly for a case where a sequence of data is inputted that is taken with the drive frequency (analysis frequency) unchanged and indicates the current-intensity increase and/or the proportion of on-the-increase current intensity gradually increasing. Similarly, the technique disclosed in Japanese Patent Application Publication No. H11-83686 diagnoses an anomaly only with the spectrum value, and therefore fails to detect an anomaly for a case where a sequence of data is inputted that indicates the current-intensity increase and/or the proportion of on-the-increase current intensity gradually increasing. However, the anomaly diagnosis apparatus 1 according to the present embodiments can detect an anomaly for a case where a sequence of data is inputted that is taken with the drive frequency (analysis frequency) unchanged and indicates the current-intensity increase and/or the proportion of on-the-increase current intensity gradually increasing.

The present invention is not limited to the embodiments described above and includes various modifications. For example, the embodiments are described in detail in order to illustrate the present invention, but the invention is not necessarily limited to include all the configurations as described above. In addition, a part of the configuration of an embodiment may be replaced by the configuration of another embodiment, or the configuration of an embodiment may be added with the configuration of another embodiment. Further, a part of the configuration of each embodiment may be removed, or added with and/or replaced by another configuration.

Additionally, the respective configurations and functions, the parts 111 to 117, and the storage 103 etc. described above may be implemented in part or entirely by hardware such as by designing an integrated circuit. In addition, as shown in FIG. 2, the respective configurations and functions may be implemented by software in a manner that a processor such as a CPU interprets and executes a program for implementing the respective functions. Information such as a program for implementing respective functions, tables, and files can be stored, other than storing in a HD, in a storage device such as a memory and a solid state drive (SSD), or a storage medium such as an integrated circuit (IC) card, a secure digital (SD) card, and a digital versatile disc (DVD).

Further, each embodiment is depicted with only control lines and information lines which are required for illustration, but not necessarily with all control lines and information lines for a product. In fact, it may be assumed that almost all components are connected with one another.

The invention claimed is:

1. An anomaly diagnosis system comprising:
a processor;
a memory coupled to the processor; and
a user terminal;
wherein the processor includes
a current-value obtaining part that obtains a value of an AC current inputted to or outputted from a device to be diagnosed;
a frequency analyzing part that converts values of the AC current obtained at intervals into a frequency spectrum which correlates a current intensity with a frequency;
an anomaly-judging-value calculating part that calculates at intervals a frequency width of the frequency spectrum at a current intensity "As" satisfying As=m×At (0<m<1), wherein "At" is a peak current intensity associated with an analysis frequency which is obtained by multiplying a frequency of the AC current by an integer that is equal to or greater than 1; and
a judging part that judges whether the frequency width is wider than that in a normal condition and, on the condition that it holds true, determines that the device is in an anomalous condition and outputs the anomalous condition to the user terminal.

2. The anomaly diagnosis system according to claim 1, wherein the integer is equal to or greater than 2.

3. The anomaly diagnosis system according to claim 2, wherein the integer is expressed as "N" to satisfy N=6M±1, where "M" is an integer being equal to or greater than 1.

4. The anomaly diagnosis system according to claim 1, wherein the judging part judges whether the device is in an anomalous condition, based on at least one of a current-intensity increase at an arbitrary frequency in the vicinity of the analysis frequency and a proportion in a unit of time during which the frequency width is wider than that in the normal condition.

5. The anomaly diagnosis system according to claim 1, wherein, on the condition that at least one of a current-intensity increase at an arbitrary frequency in the vicinity of the analysis frequency and a proportion in a unit time during which the frequency width is wider than that in the normal condition exceeds a predetermined threshold value, the judging part judges that the device is in an anomalous condition.

6. The anomaly diagnosis system according to claim 1, wherein the judging part performs clustering on at least one of current-intensity increases at an arbitrary frequency in the vicinity of the analysis frequency and proportions in a unit time during which the frequency width is wider than that in the normal condition, to judge based on a result of the clustering whether the device is in an anomalous condition.

7. The anomaly diagnosis system according to claim 1, wherein the current-value obtaining part obtains a plurality of values of the AC current, and
the frequency analysis part, the anomaly-judging-value calculating part, and the judging part judge for respective values of the AC current obtained whether the device is in an anomalous condition.

8. The anomaly diagnosis system according to claim 1, further comprising:
a voltage-value obtaining part that obtains a value of an AC voltage inputted to or outputted from the device, wherein the judging part judges whether the device is in an anomalous condition, based on a result of judging whether the frequency width is wider than that in the normal condition and values of the AC voltage.

9. The anomaly diagnosis system according to claim 8, wherein the current-value obtaining part obtains a plurality of values of the AC current and the voltage-value obtaining part obtains a plurality of values of the AC voltage, and
the frequency analysis part, the anomaly-judging-value calculating part, and the judging part judge whether the device is in an anomalous condition, based on the respective values of the AC current and the AC voltage obtained.

10. The anomaly diagnosis system according to claim 1, wherein the integer to be multiplied for obtaining the analysis frequency is set in advance based on a characteristic of the device.

11. The anomaly diagnosis system according to claim 1, wherein the "m" is set to satisfy m=0.5.

12. The anomaly diagnosis system according to claim 1, wherein the judging part judges whether the frequency width is wider than that in the normal condition by comparing the frequency width calculated by the anomaly-judging-value calculating part with a pattern of frequency width registered in advance.

13. The anomaly diagnosis system according to claim 1, wherein the device is a rotating machine.

14. An anomaly diagnosis method for an anomaly diagnosis system that detects an anomaly of a device to be diagnosed, the method comprising:
obtaining a value of an AC current inputted to or outputted from the device;
converting values of the AC current obtained at intervals into a frequency spectrum which correlates a current intensity with a frequency;
calculating at intervals a frequency width of the frequency spectrum at a current frequency "As" satisfying As=m× At (0<m<1), wherein "At" is a peak current intensity associated with an analysis frequency which is obtained by multiplying a frequency of the AC current by an integer that is equal to or greater than 1;
judging whether the frequency width is wider than that in a normal condition; and, if it holds true, judging that the device is in an anomalous condition and outputting the anomalous condition to a user terminal.

15. The anomaly diagnosis method according to claim 14, wherein the device is a rotating machine.

16. An anomaly diagnosis apparatus comprising:
a processor; and
a memory coupled to the processor;
wherein the processor includes
a current-value obtaining part that obtains at intervals a value of an AC current inputted to or outputted from a device to be diagnosed;
a frequency analyzing part that converts values of the AC current obtained at intervals into a frequency spectrum which correlates a current intensity with a frequency;
an anomaly-judging-value calculating part that calculates at intervals a frequency width of the frequency spectrum at a current intensity "As" satisfying As=m×At (0<m<1), wherein "At" is a peak current intensity associated with an analysis frequency which is obtained by multiplying a frequency of the AC current by an integer that is equal to or greater than 1; and a judging part that judges whether the frequency width is wider than that in a normal condition and, on the condition that it hold true, judges that the device is in an anomalous condition and outputs the anomalous condition to a user terminal.

17. The anomaly diagnosis apparatus according to claim 16,
wherein the device is a rotating machine.

\* \* \* \* \*